United States Patent
Shibata et al.

(10) Patent No.: US 6,727,164 B2
(45) Date of Patent: Apr. 27, 2004

(54) METHOD FOR FABRICATING A SEMICONDUCTING NITRIDE FILM, SUSCEPTOR TRAY, AND APPARATUS FOR FABRICATING A SEMICONDUCTING NITRIDE FILM

(75) Inventors: Tomohiko Shibata, Nagoya (JP); Yukinori Nakamura, Nagoya (JP); Mitsuhiro Tanaka, Nagoya (JP); Keiichiro Asai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/060,802

(22) Filed: Jan. 30, 2002

(65) Prior Publication Data

US 2002/0119642 A1 Aug. 29, 2002

(30) Foreign Application Priority Data

Feb. 2, 2001 (JP) ........................................ 2001-026317

(51) Int. Cl.[7] .............................................. H01L 21/20
(52) U.S. Cl. ...................................... 438/479; 438/483
(58) Field of Search ............................... 438/479, 478, 438/483, 22, 24, 503, 507

(56) References Cited

U.S. PATENT DOCUMENTS

| | | | | |
|---|---|---|---|---|
| 5,614,447 A | * | 3/1997 | Yamaga et al. | |
| 5,851,299 A | * | 12/1998 | Cheng et al. | |
| 6,368,450 B2 | * | 4/2002 | Hayashi | 118/728 |
| 6,521,292 B1 | * | 2/2003 | Yudovsky et al. | |
| 2002/0028343 A1 | * | 3/2002 | Shibata et al. | 428/602 |

FOREIGN PATENT DOCUMENTS

| | | |
|---|---|---|
| JP | 2-38728 | 3/1990 |
| JP | 9-266240 | 10/1997 |
| JP | 10-284425 | 10/1998 |
| JP | 2001015443 A1 | 1/2001 |

* cited by examiner

Primary Examiner—Savitri Mulpuri
(74) Attorney, Agent, or Firm—Burr & Brown

(57) ABSTRACT

In fabricating a semiconducting nitride film by a MOCVD method, a susceptor tray is employed. The susceptor tray is constructed of a base plate and an outer member detachable from the base plate. A substrate for the film to be formed upon is set in a recessed portion formed by disposing the outer member on the base plate.

7 Claims, 2 Drawing Sheets

METHOD FOR FABRICATING A SEMICONDUCTING NITRIDE FILM, SUSCEPTOR TRAY, AND APPARATUS FOR FABRICATING A SEMICONDUCTING NITRIDE FILM

BACKGROUND OF THE INVENTION

1. Field of the Invention

This invention relates to a method for fabricating a semiconducting nitride film, a susceptor and an apparatus for fabricating a semiconducting nitride film which are preferably usable for semiconductor films to construct semiconductor devices or optoelectronic devices such as light-emitting diodes and high velocity IC chips.

2. Related Art Statement

Group III nitride films including elemental Al are employed as semiconductor films constituting light-emitting diodes, and recently, win a lot of attention as semiconductor films constituting high velocity IC chips to be used in cellular phones.

Such Group III nitride films are usually fabricated by MOCVD methods using Al raw material including trimethylaluminum (TMA) or triethylaluminum (TEA) as gas and nitrogen raw material gas such as ammonia.

In this case, a substrate on which a Group III nitride film is formed is set on a susceptor tray installed in a given reactor and then heated to 1000° C. or over by a heater built in the susceptor tray or provided outside the susceptor tray. Thereafter, Al raw material gas and nitrogen raw material gas are supplied with a carrier gas onto the substrate.

Through thermochemical reactions, the raw materials are resolved into their components, which are chemically reacted, to deposit and fabricate a desired Group III nitride film on the substrate.

FIGS. 1 and 2 are a perspective view and a cross sectional view showing the arrangement of a substrate on a susceptor tray, respectively, when a semiconducting nitride film is fabricated on the substrate by a MOCVD method.

As shown in FIGS. 1 and 2, a given recessed portion 15 is formed at the center of a susceptor tray 10, and a substrate 20 is set in the recessed portion 15. Since the size of the susceptor tray 10 is much larger than that of the substrate 20, the substrate 20 can be heated uniformly. After a given semiconducting nitride film is fabricated, the substrate 20 is released from the susceptor tray 10, and post-processed.

In the practical manufacturing process of semiconducting nitride films, the susceptor tray 10 is fixed in a reactor of a MOCVD apparatus, and a plurality of substrates 20 are set into the recessed portion 15 continuously in turn. Then, semiconducting nitride films are fabricated on the substrates 20, and the substrates 20 are released from the susceptor tray 10 in turn. Therefore, during a given operation period, debris of the semiconducting nitride films, which has a similar composition to the one of the film, may be deposited on the outer surface 10A of the susceptor tray 10.

If a large amount of debris is created, the step between the substrate 20 and the susceptor tray 10 is changed, so that the flow condition of the raw material gases is changed. As a result, the fabricating condition is affected slightly, the properties of the resulting semiconducting nitride films are deteriorated.

If the debris contains many Ga elements, it can be etched and removed when the susceptor tray 10 is disposed in a hydrogen flow. However, if a plurality of semiconducting nitride films including many Al elements are fabricated, and thus the debris contains many Al elements, the debris can not be etched and removed in such a hydrogen flow.

During a long operation time, the properties of the resulting semiconducting nitride films including many Al elements are slightly changed, and thus, cannot be made stable.

When the fabricating step of forming the semiconducting nitride film is performed under a depressurized atmosphere, heat can not be transmitted to the substrate 20 from the susceptor tray 10, and thus, the temperature of the outer surface 10A of the susceptor tray 10 is higher than the surface temperature of the substrate 20, so that the above-mentioned raw material gases are thermochemically reacted in a gas phase and deposited on the outer surface 10A. As a result, the fabricating efficiency and the property of the semiconducting nitride film is deteriorated due to the intense reaction of the raw material gases at the outer surface 10A.

SUMMARY OF THE INVENTION

It is an object of the present invention to repress deterioration of the properties of the semiconducting nitride film due to the debris created on a susceptor tray during fabrication of semiconducting nitride film.

In order to achieve the above object, this invention relates to a method for fabricating a semiconducting nitride film, comprising the steps of:

preparing a susceptor tray constructed of a base plate and an outer member, setting a substrate in the recessed portion formed by disposing the outer member on the base plate, and fabricating a semiconducting nitride film on the substrate.

In the fabricating method of the present invention, a substrate is set on the base plate of a susceptor tray so as to be surrounded by the outer member of the susceptor tray which is separately provided from the base plate. Therefore, the substrate can be heated uniformly by a heater built in or provided outside the susceptor tray, and a given semiconducting nitride film is fabricated on the substrate as usual.

In this case, the debris of the semiconducting nitride film is deposited on the outer member of the susceptor tray. However, since the outer member is detachable for the base plate of the susceptor tray, if the debris is deposited to some degree, only the outer member is taken out and washed, to remove the deposited debris easily.

If the outer member is made of a material of low optical absorption coefficient, that is, an optically transparent material of high transmissivity, the heating of the outer member due to radiation is inhibited, and thus, the reaction of raw material gases on the outer member, which results in the deterioration in the property of semiconducting nitride film, can be inhibited.

Also, since the outer member is exchangeable, a new outer member can be substituted for an old one, so that semiconducting nitride films can be made stable without washing.

BRIEF DESCRIPTION OF THE DRAWINGS

For better understanding of the present invention, reference is made to the attached drawings, wherein.

DETAILED DESCRIPTION OF THE INVENTION

Figure 1:
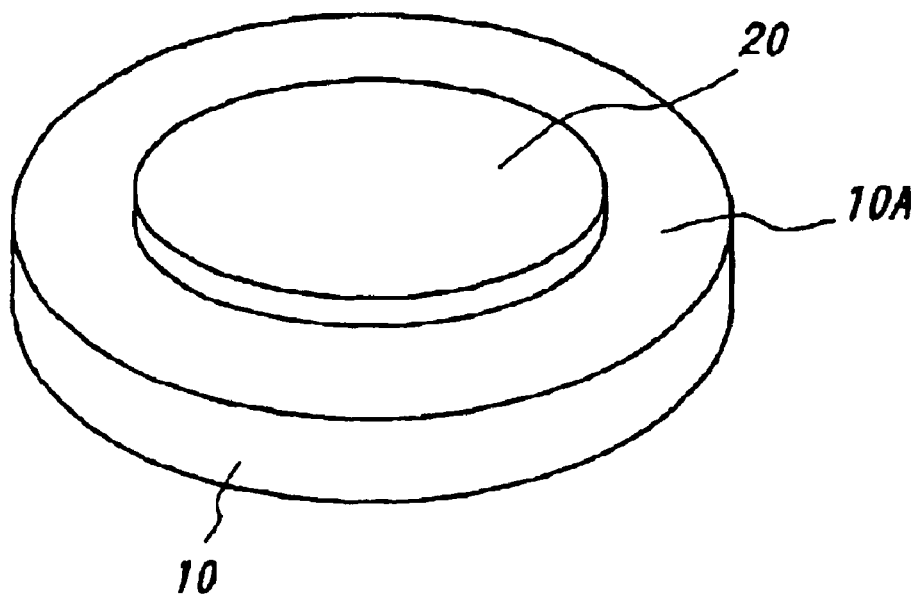
FIG. 1 is a perspective view showing the arrangement of a substrate on a susceptor tray when a semiconducting nitride film is fabricated on the substrate by a MOCVD method.
Figure 2:
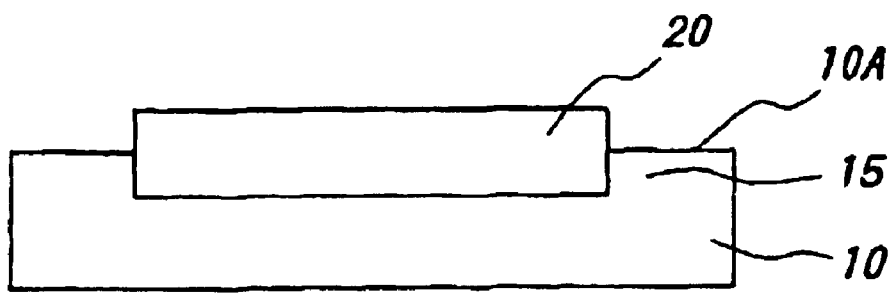
FIG. 2 is a cross sectional view showing the arrangement of a substrate on a susceptor tray when a semiconducting nitride film is fabricated on the substrate by a MOCVD method.
Figure 3:
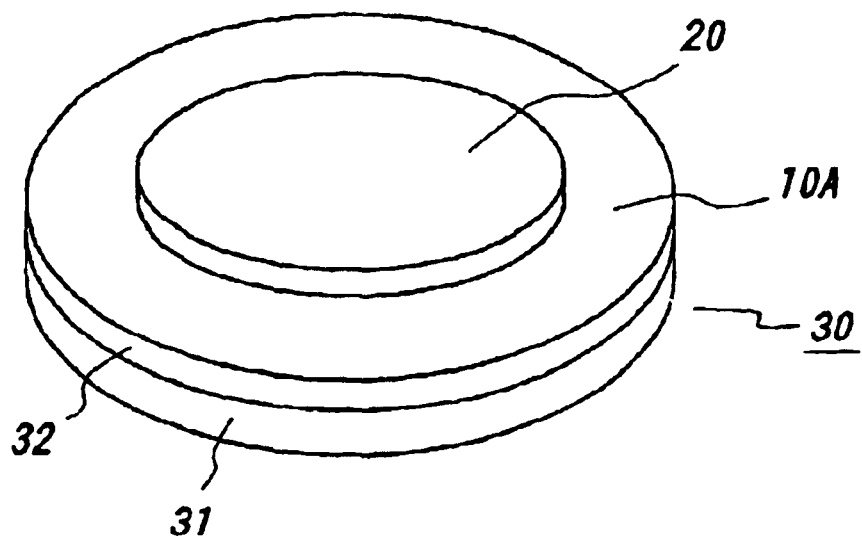
FIG. 3 is a perspective view showing the arrangement of a substrate on a susceptor tray according to the present invention when a semiconducting nitride film is fabricated on the substrate by a MOCVD method.
Figure 4:
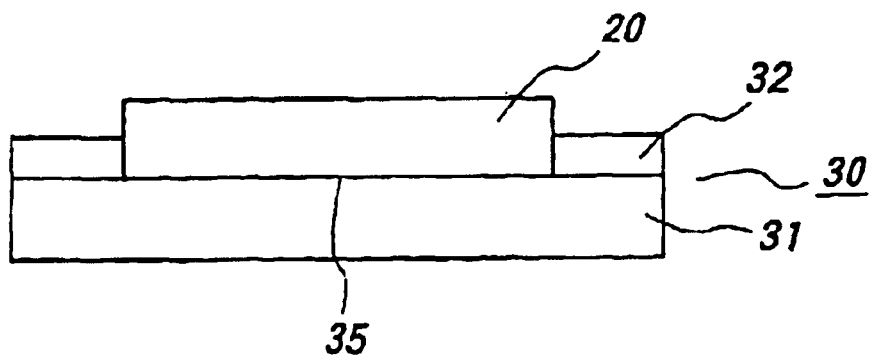
FIG. 4 is a cross sectional view showing the arrangement of a substrate on a susceptor tray according to the present invention when a semiconducting nitride film is fabricated on the substrate by a MOCVD method.

This invention will be described in detail, hereinafter. FIGS. 3 and 4 are a perspective view and a cross sectional view showing the arrangement of a substrate on a susceptor tray according to the present invention, respectively, when a semiconducting nitride film is fabricated on the substrate by a MOCVD method.

A susceptor tray 30 as depicted in FIGS. 3 and 4 includes a base plate 31 and an outer member 32, and a substrate 20 is set into the recessed portion 35 formed by disposing the outer member 32 on the base plate 31. As shown in FIG. 4, substantiallY no space is provided between the inner peripheral portion of the outer ember 32 and the outer peripheral portion of the substrate 20 in the recessed portion 35.

The outer member 32 is detachable from the base plate 31. Therefore, even though a plurality of semiconducting nitride films are fabricated during a given period, and thus, the debris of the films are deposited on the outer member 32, the debris can be easily removed by detaching and washing the outer member 32. Therefore, the semiconducting nitride films can be fabricated continuously and stably for a long time operation.

The outer member 32 which is used and polluted by the debris is exchangeable for a new one. Therefore, if the outer member 32 is exchanged by a new one, the debris can be easily removed without washing, and thus, semiconducting nitride films can be also fabricated continuously and stably for a long time operation.

The configuration of the outer member 32 is not restricted, but can be defined, dependent on the shape of the substrate 20. However, since the substrate 20 is usually made in circular shape, the outer member is preferably made in ring-like shape.

Since the susceptor tray 30 itself is heated by a heater, it must be made of a heat resistance material.

It is desired that a semiconducting nitride film including elemental Al is made under a depressurized atmosphere, particularly of 100 Torr or below, more particularly of 50 Torr or below by a MOCVD method. In this case, the substrate 20 on which the film is formed is heated to about 1100° C. or over, particularly within a range of 1100–1250° C. Thereby, the crystallinity of the nitride film can be developed, and thus, the crystallinities of various films which are fabricated on the nitride film can be also developed.

After a given operation period has elapsed, the outer member 32 may be heated to a higher temperature by optical irradiation, and thus, much debris from the semiconducting nitride film process may be deposited on the outer member 32. Therefore, it is desired that the outer member 32 is made of an optically transparent material which has an average absorption rate of 0.1 cm$^{-1}$ or below, particularly 0.01 cm$^{-1}$ or below within a wavelength range of 400–700 nm.

As such an optically transparent material are exemplified sapphire, AlN, and BN. Herein, the above-mentioned average absorption rate is defined in a single crystalline material which does not have grain boundaries to disturb and scatter travel of light.

Moreover, the base plate 31 of the susceptor tray 30 may be made of a ceramic nitride such as AlN, SiN, BN and sialon or an alumina-silicon carbon composite material well known.

The fabricating method using a susceptor tray as mentioned above of the present invention can be preferably used for a semiconducting nitride film including Al element of 50 atomic percent or over for all of the Group III elements, particularly AlN film.

Although the present invention was described in detail with reference to the above examples, this invention is not limited to the above disclosure and every kind of variation and modification may be made without departing from the scope of the present invention.

As explained above, in fabricating a semiconducting nitride film, particularly including elemental Al, a susceptor tray which is constructed of a base plate and an outer member is employed, and the outer member is set detachable for the base plate. Therefore, when debris from a Group III nitride film is deposited on the outer member, it can be removed by washing or exchanging the used outer member for a new one, so that the change in the properties of the semiconducting nitride film due to the debris can be inhibited.

What is claimed is:

1. A method for fabricating a semiconducting nitride film, comprising the steps of:

preparing a susceptor tray comprising an outer member and a base plate, said outer member being disposed on said base plate to form a recessed portion, wherein said outer member is detachable and has an annular shape;

setting a substrate in said recessed portion; and fabricating said semiconducting nitride film on said substrate;

wherein substantially no space is provided between an inner peripheral portion of said outer member and an outer peripheral portion of said substrate in said recessed portion.

2. The fabricating method of claim 1, wherein said outer member comprises an optically transparent material having an average optical absorption rate of 0.1 cm$^{-1}$ or below within a wavelength range of 400–700 nm.

3. The fabricating method of claim 1, wherein said semiconducting nitride film includes elemental Al.

4. The fabricating method of claim 3, wherein the Al content of said semiconducting nitride film is 50 atomic percent or over.

5. The fabricating method of claim 4, wherein said semiconducting nitride film comprises AlN.

6. The fabricating method of claim 3, wherein said semiconducting nitride film is fabricated at 1100° C. or over by a CVD method.

7. The fabricating method of claim 1, wherein said semiconducting nitride film is fabricated under a depressurized atmosphere by a CVD method.

* * * * *